United States Patent
Vergith et al.

(10) Patent No.: US 7,978,281 B2
(45) Date of Patent: Jul. 12, 2011

(54) LOW STRESS MOUNTING SUPPORT FOR RUGGEDIZED DISPLAYS

(75) Inventors: Nicholas D. Vergith, Holly, MI (US); David A. Garrett, Shelby Township, MI (US); John P. Quigley, Rochester Hills, MI (US)

(73) Assignee: General Dynamics Land Systems, Sterling Heights, MI (US)

( * ) Notice: Subject to any disclaimer, the term of this patent is extended or adjusted under 35 U.S.C. 154(b) by 215 days.

(21) Appl. No.: 12/211,586

(22) Filed: Sep. 16, 2008

(65) Prior Publication Data

US 2010/0066936 A1 Mar. 18, 2010

(51) Int. Cl.
G02F 1/1333 (2006.01)

(52) U.S. Cl. ....... 349/58; 349/59; 349/161; 361/679.21; 361/679.26

(58) Field of Classification Search .................... 349/58, 349/59, 60, 161; 361/679.21, 679.26
See application file for complete search history.

(56) References Cited

U.S. PATENT DOCUMENTS

| | | | |
|---|---|---|---|
| 5,606,438 A | 2/1997 | Margalit et al. | |
| 5,717,476 A * | 2/1998 | Kanezawa | 349/149 |
| 6,252,639 B1 | 6/2001 | Giannatto | |
| 6,327,011 B2 | 12/2001 | Kim | |
| 6,504,713 B1 | 1/2003 | Pandolfi et al. | |
| 6,532,152 B1 | 3/2003 | White et al. | |
| 6,871,138 B1 | 3/2005 | Minelli | |
| 6,955,840 B2 | 10/2005 | Kim | |
| 7,027,112 B2 | 4/2006 | Wang et al. | |
| 7,201,965 B2 | 4/2007 | Gulati et al. | |
| 2001/0010569 A1 | 8/2001 | Jin et al. | |
| 2001/0052814 A1 | 12/2001 | Takita | |
| 2004/0125269 A1 | 7/2004 | Kim et al. | |
| 2004/0135773 A1 * | 7/2004 | Bang et al. | 345/173 |
| 2005/0030707 A1 | 2/2005 | Richardson et al. | |

(Continued)

FOREIGN PATENT DOCUMENTS

JP 2001004994 1/2001

OTHER PUBLICATIONS

"Industrial Monitors", <http://web3.automationdirect.com/adc/Overview/Catalog/Industrial_PC_Products/Industrial_Monitors>, printed Jan. 23, 2008.
"Ruggedized LCD assembly for tactical display and other ruggedized tactical gear from Thomas Electronics", <www.thomaselectronics.com/tactical/lcd_amination_overview/php>, printed Jan. 23, 2008.
Search report for International Application No. PCT/US09/05102, Jan. 23, 2009.

*Primary Examiner* — Michael H Caley
(74) *Attorney, Agent, or Firm* — Kaye Scholer LLP

(57) ABSTRACT

Embodiments of the present invention may include an apparatus and method for ruggedizing a Liquid Crystal Display (LCD). Embodiments of the present invention may be configured to impart little or no stress to the LCD, while also shielding the LCD from adverse effects of electromagnetic interference (EMI). A conductive adhesive, a metal frame, and a assembly support panel may be used to provide a electrically conductive path for controlling the EMI. A protective glass may be used to shield the LCD from environmental effects and a heater glass allows for operation of the LCD in different thermal conditions.

25 Claims, 2 Drawing Sheets

U.S. PATENT DOCUMENTS

| | | |
|---|---|---|
| 2005/0212990 A1* | 9/2005 | Robinder ........................ 349/58 |
| 2005/0285990 A1* | 12/2005 | Havelka et al. ................. 349/58 |
| 2006/0137587 A1 | 6/2006 | Aisenbrey |
| 2007/0131833 A1 | 6/2007 | Maloney et al. |
| 2007/0139576 A1 | 6/2007 | Hunt et al. |
| 2007/0252922 A1 | 11/2007 | Oohira |
| 2007/0268425 A1 | 11/2007 | Jung |
| 2007/0297160 A1 | 12/2007 | Cochrane et al. |
| 2008/0049183 A1 | 2/2008 | Dunn et al. |
| 2008/0100996 A1 | 5/2008 | Wang |

* cited by examiner

LOW STRESS MOUNTING SUPPORT FOR RUGGEDIZED DISPLAYS

FIELD OF THE INVENTION

The present invention relates to displays, and in particular to displays that are ruggedized to impart little or no stress onto the display.

BACKGROUND OF THE INVENTION

Liquid crystal displays (LCD) may be adversely affected by stress. An example includes the temporary picture distortion created when applying a force onto the glass substrate of a LCD TV screen or a LCD computer monitor. Picture distortion may become permanent if the stress imparted to the LCD permanently damages parts of the LCD, for example when the LCD device is dropped from a height. Permanent distortion may also result from a stress that constantly imparts a force or load on an LCD. In order to qualify for certain military applications, ruggedized LCD devices may be required to withstand threshold levels of stress and certain extreme environments. Also, ruggedized LCD devices may be required to have a seal in order to prevent external fluids from entering the device, which can adversely affect performance of the device.

Attempts to ruggedize LCD displays, often against high impact forces, have used laminated strengthening glass elements to give the LCD more strength. However, in some cases, these attempts have resulted in permanent distortion around the peripheral portion of the display in proximity of the mounting elements. Other efforts to ruggedize LCD displays, such as applying a hard adhesive on the periphery of the LCD to bind the LCD to a frame, have also resulted in similar distortion. Often, this distortion around the periphery of the display is referred to as window framing of the LCD. In addition, window framing may become further pronounced if the LCD device is subject to temperature extremes. Exposure to temperature extremes causes differential expansion to the different elements making up the device and may build up stress on the LCD case. This may also lead to warping of the case and bending stresses on the LCD.

Prior attempts to ruggedize the LCD include U.S. Pat. No. 6,871,138 B1 to Minelli, which discloses an electronic device that has a housing bonded to a touch panel with flexible adhesive that is intended to prevent fluid from reaching an enclosed display. Another attempt to ruggedize an LCD includes U.S. Pat. No. 5,606,438 to Margalit et al., which discloses the use of a LCD sandwich structure, where the LCD is bonded to two glass substrates through the use of an adhesive film. However, these prior attempts may suffer from issues related to the ability of the device to withstand stress and certain environmental conditions, as well as shielding against EMI.

SUMMARY OF THE INVENTION

In addition to the above, LCD devices, in accordance with embodiments of the present invention, may be shielded against electromagnetic interference (EMI), which may adversely affect the operation of the LCD by causing noise signals and snow in the display. Embodiments of the invention may also provide for the reduction of compression and bending forces on a display packaging and the display, resulting in significant reduction of window framing. In addition, embodiments of the present invention may employ an electrically conductive path to control the effects of EMI.

According to one embodiment of the present invention, a ruggedized display device may comprise a LCD, a first glass element, a second glass element, a metal frame, and an assembly support panel. The first glass element may be bonded to the LCD with a first adhesive, while the second glass element is bonded to the first glass element. The metal frame may be bonded to the second glass element with a second adhesive, while the assembly support panel is arranged to support the metal frame. The second adhesive may be conductive, and the assembly support panel may be conductive in order to form an electrically conductive path.

According to another embodiment of the invention, a method for ruggedizing a display may comprise: bonding a display to a first glass element with a first adhesive; bonding a second glass element to the first glass element; bonding the second glass element to a metal frame with a second adhesive, where the second adhesive is conductive; mounting the metal frame to an assembly support panel, which may be conductive; and forming an electrically conductive path between the second adhesive, the metal frame, and the assembly support panel.

According to another embodiment of the invention, a ruggedized display may comprise: a display, a first glass element bonded to the display with a first adhesive, a second glass element bonded to the first element, and an assembly support panel. The second glass element may be configured to shield against electromagnetic interference, while the assembly support panel may be configured to support the display and to conduct an electrical charge. The second glass element and the assembly support panel may form an electrically conductive path. The display may comprise one of the following types of display: a liquid crystal display, a field emission display, a surface-conductor electron-emitter display, a plasma display, a vacuum fluorescent display, a light emitting diode display, and an interferometric modulator displays.

DETAILED DESCRIPTION OF THE FIGURES

Figure 1:
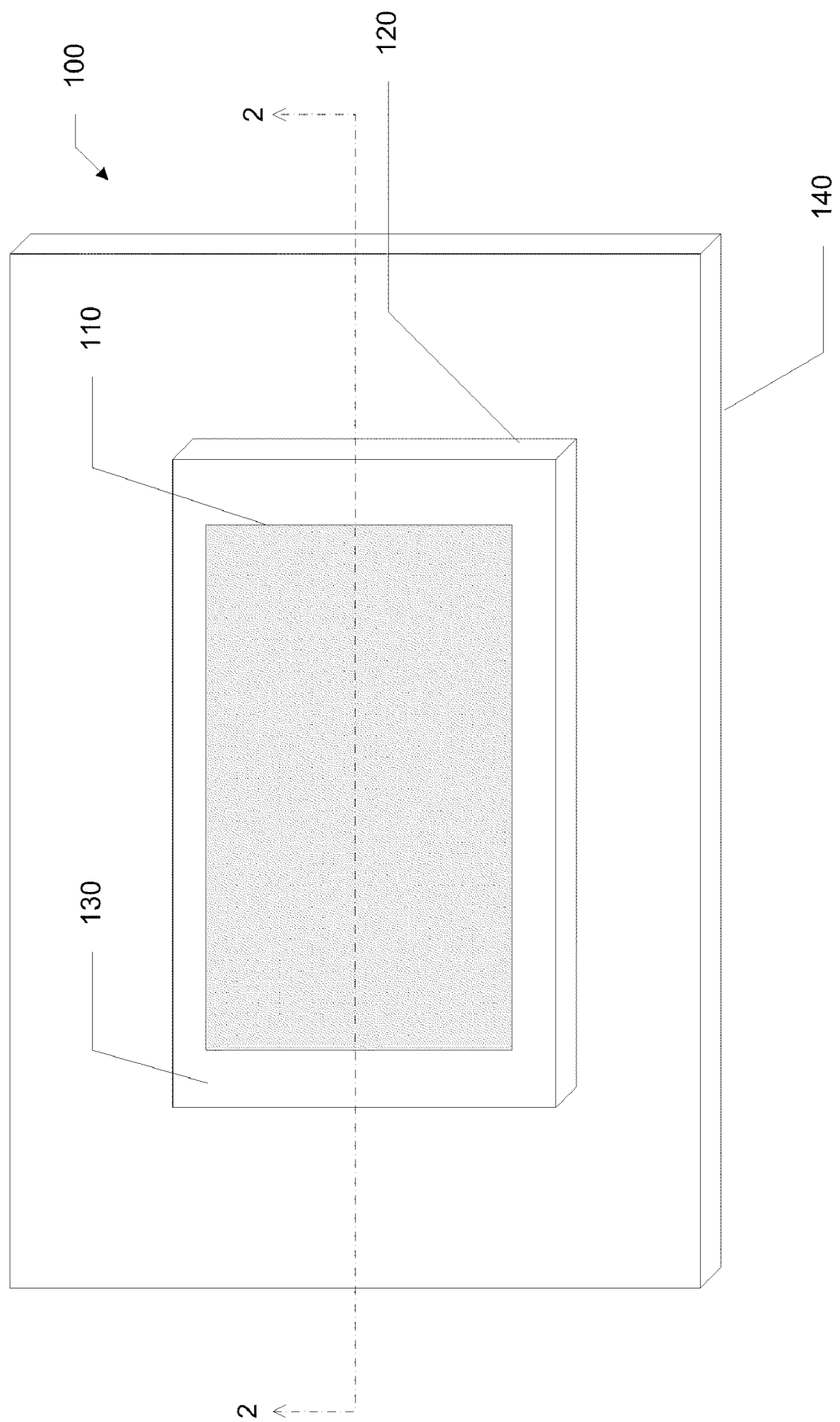
FIG. 1 illustrates a perspective view of a device incorporating a ruggedized display in accordance with an embodiment of the invention.

Referring to FIG. 1, a ruggedized display 100 comprises a liquid crystal display (LCD) 110 mounted to an assembly support panel 120. Walls 130 of the LCD support panel 120 protect the LCD 110. In one example, the LCD 110 may be provided by an Original Equipment Manufacturer (OEM). The LCD 110 and the LCD assembly support panel 120 are then installed onto a mounting panel 140. The mounting panel 140 may comprise an instrument panel, a dashboard, a mounting member, or a wall, for example.

Figure 2:
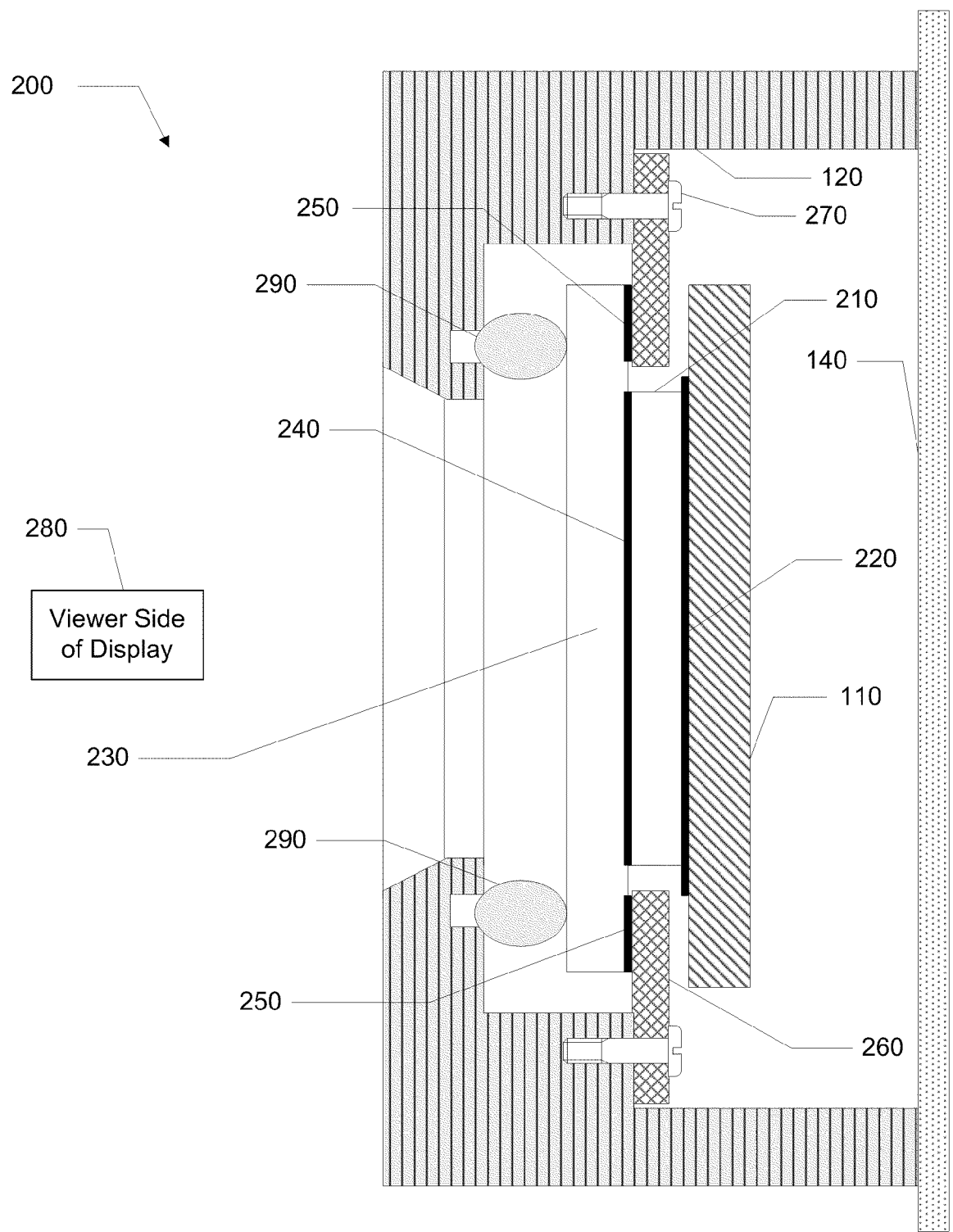
FIG. 2 illustrates a cross-sectional view of FIG. 1.

FIG. 2 illustrates a cross-sectional view of a ruggedized display as shown in FIG. 1 disposed upon a mounting panel 140. Referring to FIG. 2, a ruggedized display 200 comprises a LCD 110 bonded to a heater glass 210 with an adhesive 220. The heater glass 210 may comprise a glass coated with Indium Tin Oxide (ITO), for example. The adhesive 220 may comprise a transparent optical adhesive sufficiently soft to avoid imparting a force onto LCD 110. An example of a soft adhesive may be a silicone-based adhesive and may be acquired from Dontech, Inc. of Doylestown, Pa., for example. The adhesive 220 protects the LCD 110 from compressive stresses that cause breakage and window framing. In one example, a filler glass may replace the heater glass 210 when the device will not be subject to heat in use. The heater glass 210 (or filler glass) may aid in the structural properties of the LCD to prevent any potential warping or any malfunctioning of the display properties of the LCD, while also providing an additional level of protection to the LCD 110.

A protective glass 230 provides structural stiffness and strength in order to protect the LCD 110 from stresses resulting from, among other things, incidental impacts such as falling tools, for example. In another embodiment of the invention, the protective glass 230 may also comprise a touch screen. An LCD assembly support panel 120 receives the LCD 110 and also provides the structural stiffness and strength. In one example, the LCD assembly support panel 120 may be metallic or coated with a conductive layer in order to conduct a charge.

Electromagnetic interference (EMI), produced by many electromagnetic devices, can impair the operation of the LCD 110. Over time, the protective glass 230 may be coated with EMI. In order to combat EMI, a conductive adhesive 250 bonds the protective glass 230 to a metal frame 260, which can be attached to the LCD assembly support panel 120 with a mechanical screw 270 or other mechanical fastener, such as conductive adhesives, nails, clamps, or spring clamps. The conductive adhesive 250 may be configured to provide a conductive path between the protective glass 230 and the LCD assembly support panel 120. The protective glass 230, the conductive adhesive 250, the metal frame 260, and the LCD assembly support panel 120 are electrically connected to form a Faraday cage for shielding the LCD 110 from the adverse effects of EMI. The Faraday cage may obviate the need of an EMI gasket, which is costly and has reliability problems.

In another embodiment of the invention, the mechanical screw 270 or other such mechanical fastener may form a portion of an electrically conductive path. In the example of FIG. 2, the LCD assembly support panel 120 may include threaded holes for retaining the metal frame 260 using the mechanical screw 270. The mechanical screw 270 may be incorporated into the Faraday cage to control EMI leakage.

In one embodiment of the invention, the conductive adhesive 250 may comprise a metal particle filled thermal set adhesive. In another embodiment of the invention, the conductive adhesive 250 may comprise a metal filled pressure sensitive adhesive. An example of a conductive adhesive 250 may be acquired from 3M, Inc. of St. Paul, Minn., for example. In another embodiment of the invention, it is also contemplated that multiple conductive adhesives may be used together. For example, an Indium Tin Oxide (ITO) coating may be arranged in the middle of the protective glass 230 while a silver epoxy (or a silver fired-on fritt) may be used around the periphery where the metal frame 260 and the protective glass 230 meet.

The metal frame 260 may be made thin to reduce the weight and to bring the LCD closer to the viewer side of the display, but also stiff enough to ensure the integrity of the ruggedized LCD. The metal frame 260 may comprise, among others, aluminum, stainless steel, or copper. The metal frame 260 may define a recess or a hole to receive the LCD 100 and the protective glass 210 in order to provide sufficient shielding from the effects of EMI. Also in the example of FIG. 2, a seal 290 may be used to provide for an environmental seal to prevent fluid and other such contaminants from getting past the protective glass 230 to the thin metal frame 260 or the conductive adhesive 250. The seal 290 may be an elastomer (rubber), for example.

In accordance with one embodiment of the present invention, the thickness of the heater glass 210 may be selected provide further protection from internal stress and impacts faced by a ruggedized LCD 200. Therefore, the presence of the heater glass 210 may allow the use of a thinner version of the protective glass 230 in order to adequately protect the LCD 110.

It should be understood that the adhesives, the protective glass elements, the LCD assembly support panel, and the LCD contemplated under the present invention should not be construed as limited to those examples shown in FIG. 1. For example, the present invention may also include, but should not be limited to, an optical filter and a conductive coating on the protective glass. In another embodiment of the invention, the transparent optical adhesive between the two protective glasses may be removed, leaving an air gap that functions as a thermal insulator. In addition, the present invention may be used for all ruggedized displays in tanks, planes, or ships. Furthermore, while embodiments illustrated in FIGS. 1 and 2 illustrate the use of a LCD, embodiments of the invention may be used to ruggedize other types of displays, such as field emission displays, surface-conductor electron-emitter displays, plasma displays, vacuum fluorescent displays, light emitting diodes, and interferometric modulator displays, for example.

The foregoing descriptions of preferred embodiments of the present invention are presented for purposes of illustration and description. They are not intended to be exhaustive or to limit the invention to the precise forms disclosed. Obviously, many modifications and variations are possible in view of the above teachings. Various modifications related to the particular use are also possible. The scope of the invention is to be defined only by the claims appended hereto, and by their equivalents.

What is claimed is:

1. A ruggedized display device, comprising:
a liquid crystal display (LCD);
a first glass element bonded to the LCD with a first adhesive;
a second glass element having a first surface bonded to the first glass element;
a metal frame bonded to the second glass element with a second adhesive on a second surface of the second glass element, the second adhesive being conductive, the metal frame defining a recess to receive the first glass element, the metal frame being bonded to the second glass element without contacting the LCD; and
an assembly support panel configured to support the metal frame, the assembly support panel being conductive and containing the LCD;
wherein the second adhesive, the metal frame, and the assembly support panel form an electrically conductive path.

2. The ruggedized display device of claim 1, wherein the electrically conductive path is configured to shield the LCD from electromagnetic interference (EMI).

3. The ruggedized display device of claim 2, wherein the electrically conductive path forms a Faraday cage.

4. The ruggedized display device of claim 3, wherein the Faraday cage provides sufficient shielding from EMI without using an EMI gasket.

5. The ruggedized display device of claim 1, wherein
the metal frame directly contacts the assembly support panel.

6. The ruggedized display device of claim 1, wherein the first glass element comprises at least one of: a heater glass or a filler glass.

7. The ruggedized display device of claim 1, wherein the second glass element comprises at least one of: a protective glass or a touch screen glass.

8. The ruggedized display device of claim 1, wherein the first adhesive comprises a transparent optical adhesive.

9. The ruggedized display device of claim 1, wherein the second adhesive comprises at least one of: a metal particle filled thermal set adhesive or a metal filled pressure sensitive adhesive.

10. The ruggedized display device of claim 1, further comprising a seal in contact with the assembly support panel.

11. The ruggedized display device of claim 1, further comprising a conductive fastener configured to mount the metal frame to the assembly support panel.

12. A method for ruggedizing a display, comprising:
bonding a display to a first glass element with a first adhesive;
bonding a second glass element to the first glass element on a first surface of the second glass element;
bonding the second glass element to a metal frame with a second adhesive on a second surface of the second glass element, the second adhesive being conductive, the metal frame being bonded to the second glass element without contacting the display;
receiving the first glass element within a recess of the metal frame; and
mounting the metal frame to a conductive assembly support panel, thereby forming a electrically conductive path between the second adhesive, the metal frame, and the assembly support panel.

13. The method for ruggedizing the display of claim 12, wherein the electrically conductive path is formed to shield the display from electromagnetic interference (EMI).

14. The method for ruggedizing the display of claim 13, wherein the electrically conductive path forms a Faraday cage.

15. The method for ruggedizing the display of claim 14, wherein the Faraday cage provides sufficient shielding from EMI without using an EMI gasket.

16. The method for ruggedizing the display of claim 12, wherein
the metal frame directly contacts the assembly support panel.

17. The method for ruggedizing the display of claim 12, wherein the first glass element comprises at least one of: a heater glass or a filler glass.

18. The method for ruggedizing the display of claim 12, wherein the second glass element comprises at least one of: a protective glass or a touch screen glass.

19. The method for ruggedizing the display of claim 12, wherein the first adhesive is a transparent optical adhesive.

20. The method for ruggedizing the display of claim 12, wherein the second adhesive comprises at least one of: a metal particle filled thermal set adhesive or a metal filled pressure sensitive adhesive.

21. The method for ruggedizing the display of claim 12, wherein mounting the metal frame to the assembly support panel comprises a conductive fastening means.

22. The method for ruggedizing the display of claim 12, further comprising providing a seal in contact with the assembly support panel.

23. The method for ruggedizing the display of claim 12, wherein the display comprises at least one of the following: a liquid crystal display, a field emission display, a surface-conductor electron-emitter display, a plasma display, a vacuum fluorescent display, a light emitting diode display, and an interferometric modulator display.

24. A ruggedized display device, comprising:
a display;
a first glass element bonded to the display with a first adhesive;
a second glass element having a first surface bonded to the first glass element with a second adhesive, the second glass element configured to conduct an electrical charge; and
an assembly support panel configured to support the display and to conduct an electrical charge, the assembly support panel being coupled to the second glass element without contacting the display;
wherein the second glass element and the assembly support panel form an electrically conductive path.

25. The ruggedized display device of claim 24, further comprising a metal frame bonded to the second glass element with a third adhesive, the third adhesive comprising a conductive adhesive.

* * * * *